(12) United States Patent
Lopatin et al.

(10) Patent No.: US 6,297,157 B1
(45) Date of Patent: Oct. 2, 2001

(54) TIME RAMPED METHOD FOR PLATING OF HIGH ASPECT RATIO SEMICONDUCTOR VIAS AND CHANNELS

(75) Inventors: Sergey D. Lopatin, Santa Clara; Matthew S. Buynoski, Palo Alto, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/431,516

(22) Filed: Nov. 1, 1999

(51) Int. Cl.[7] .................. H01L 21/44; H01L 21/4763; C15D 5/18; C25D 5/02
(52) U.S. Cl. .................. 438/687; 438/622; 438/625; 438/638; 438/672; 438/675; 438/686; 205/102; 205/123
(58) Field of Search .................. 438/687, 678, 438/622, 625, 637, 638, 686, 672, 674, 675; 205/102, 103, 104, 123

(56) References Cited

U.S. PATENT DOCUMENTS

| | | | |
|---|---|---|---|
| 4,514,265 | 4/1985 | Rao et al. | 204/15 |
| 4,666,567 * | 5/1987 | Loch | 204/14.1 |
| 4,869,971 | 9/1989 | Nee et al. | 428/635 |
| 5,039,381 | 8/1991 | Mullarkey | 204/58.5 |
| 5,326,454 | 7/1994 | Engelhaupt | 205/67 |
| 5,723,028 | 3/1998 | Poris | 204/231 |

OTHER PUBLICATIONS

Alan C. West, Chin–Chang Cheng, and Brett C. Baker, "Pulse Reverse Copper Electrodeposition in High Aspect Ratio Trenches and Vias", *J. Electrochemical Society*, vol. 145, No. 9, pp. 3070–3074, Sep. 1998.

Yosi Shacham–Diamand & Sergey Lopatin, "High Aspect Ratio Quarter–Micron Electroless Copper Integrated Technology", *Microelectronic Engineering*, 37/38, 1997, pp. 77–78.

L.M. Weisenberger, "Copper Plating", *Metals Handbook Ninth Edition*, vol. 5: Surface Cleaning, Finishing, and Coating, American Society for Metals, pp. 159–169.

* cited by examiner

Primary Examiner—Charles Bowers
Assistant Examiner—Thanhha Pham
(74) Attorney, Agent, or Firm—Mikio Ishimaru

(57) ABSTRACT

A method is provided for forming conductive layers in semiconductor vias by using forward and reverse pulses during the electroplating process which have time intervals between pulses which increase with time and for forming conductive layers in semiconductor channels by using forward pulses during the electroplating process which have time intervals between pulses which also increase with time. This allows fast deposition while reducing the deposition stress to eliminate voids and speeds up the overall manufacturing process.

20 Claims, 3 Drawing Sheets

TIME RAMPED METHOD FOR PLATING OF HIGH ASPECT RATIO SEMICONDUCTOR VIAS AND CHANNELS

CROSS-REFERENCE TO RELATED APPLICATIONS

The present application contains subject matter related to a copending application entitled "Method for Ramped Current Density Plating of Semiconductor Vias and Trenches" by Sergey D. Lopatin and John A. Iacoponi. The related application was filed on Mar. 26, 1999, is identified by Ser. No. 09/276,839, and is commonly assigned to Advanced Micro Devices, Inc.

The present application further contains subject matter related to a copending application entitled "Method for Low Stress Plating of Semiconductor Vias and Trenches" by Sergey D. Lopatin. The related application was filed on Mar. 26, 1999, is identified by Ser. No. 09/276,840, and is commonly assigned to Advanced Micro Devices, Inc.

TECHNICAL FIELD

The present invention relates generally to semiconductors and more specifically to electroplating of conductors used in semiconductors.

BACKGROUND ART

In the manufacturing of integrated circuits, after the individual devices, such as the transistors, have been fabricated in the silicon substrate, they must be connected together to perform the desired circuit functions. This connection process is generally called "metallization" and is performed using a number of different photolithographic and deposition techniques.

One metallization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an adhesive layer is deposited to coat the walls of the first channel opening to ensure good adhesion and then a barrier layer to act as a barrier material to prevent diffusion of such conductive material into the oxide layer and the semiconductor devices. Depending upon the materials used, the adhesion layer may not be required so the combination of the adhesion and barrier material or the barrier material alone is collectively referred to as "barrier layer" herein. A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metallization process, which is called the "dual damascene" technique, may be used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate via areas over the first channels.

A nitride etch is then used to etch out the via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by an electroplating of the conductive material on the seed layer in the second channel openings and the via openings to form the second channel and the via. A second chemical-mechanical polishing process leaves the two vertically separated, horizontally perpendicular channels connected by a via.

The use of the damascene techniques eliminates metal etch and dielectric gap fill steps typically used in the metallization process. The elimination of metal etch steps is important as the semiconductor industry moves from aluminum to other metallization materials, such as copper, which are very difficult to etch.

When the current density of the electroplating process is increased to speed deposition, there is a tendency for voids to form in the vias. This tends to increase current density further, which increases the size of the voids until open circuits occur.

A fast, but low stress method of electroplating has been long sought but has eluded those skilled in the art. Further, a method which would assure void-free filling of high aspect ratio vias and channels has been equally long sought. As the semiconductor industry is moving from aluminum to copper and other type of materials with greater electrical conductivity and thinner channels and vias, it is becoming more pressing that a solution be found.

DISCLOSURE OF THE INVENTION

The present invention provides a method for forming conductive layers in semiconductor channels and vias by using forward pulses during the electroplating process which have time intervals between pulses which increase with time. This allows fast deposition while reducing the deposition stress to eliminate voids in high aspect ratio vias and channels. This speeds up the overall manufacturing process while preventing void formation.

The present invention further provides a method for forming conductive layers in semiconductor vias by using forward and reverse pulses during the electroplating process which have time intervals between pulses which increase with time and for forming conductive layers in semiconductor channels by using forward pulses during the electroplating process which have time intervals between pulses which also increase with time. This allows fast deposition while reducing the deposition stress to eliminate voids in high aspect ratio vias and channels. This speeds up the overall manufacturing process while preventing void formation.

The present invention further provides a method for forming conductive layers in semiconductors by using pulses during the electroplating process which have time intervals between pulses which increase with time. This allows fast deposition while reducing the deposition stress to eliminate voids in high aspect ratio vias and channels.

The present invention further provides a method for forming conductive layers in semiconductors by using pulses during the electroplating process which have time intervals between pulses which increase in steps with time. This allows fast deposition while reducing the deposition stress to eliminate voids in high aspect ratio vias and channels.

The present invention further provides a method for forming conductive layers in semiconductors by using pulses during the electroplating process which have time intervals between pulses which gradually increase with time. This allows fast deposition while reducing the deposition stress to eliminate voids in high aspect ratio vias and channels.

The present invention further provides a method for forming copper layers in semiconductors by using pulses during the electroplating process which have time intervals between pulses which increase with time. This allows fast deposition while reducing the deposition stress to eliminate voids in high aspect ratio vias and channels.

The above and additional advantages of the present invention will become apparent to those skilled in the art from a reading of the following detailed description when taken in conjunction with the accompanying drawings.

BEST MODE FOR CARRYING OUT THE INVENTION

Organization

Figure 1A:
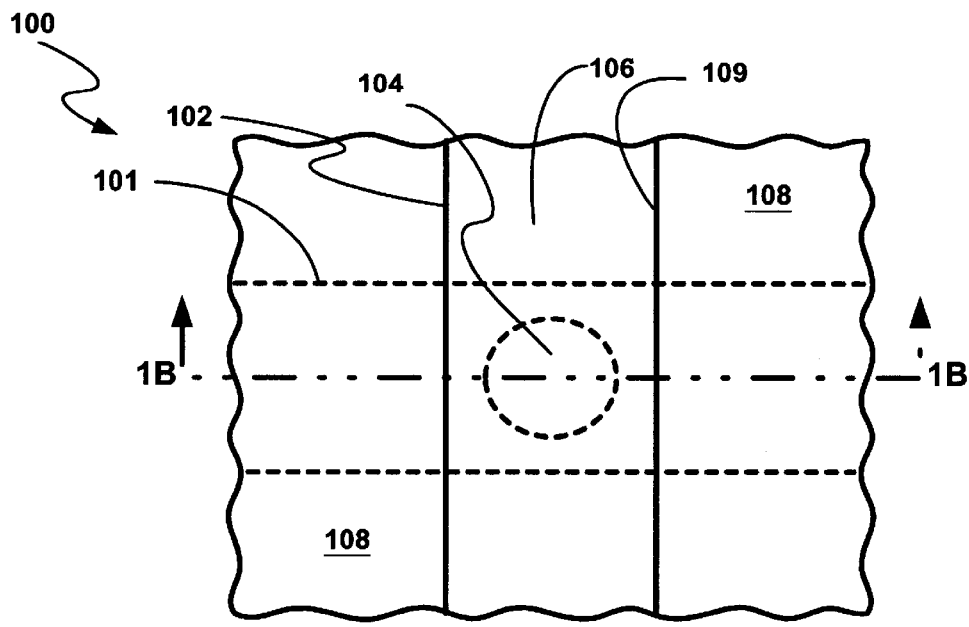
FIG. 1A (PRIOR ART) is a plan view of aligned channels with a prior art via.

Referring now to FIG. 1A (PRIOR ART), therein is shown a plan view of a prior art pair of perpendicularly aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a via 120 connects the first and second channels 101 and 102 and is a part of the second channel 102. The first channel 101 is made up of a first conductive material. The second channel 102 is formed by filling a second channel opening 106 disposed in a second channel oxide layer 108 with a second conductive material. The second channel opening 106 is defined by walls (sidewalls) 109 of a second channel oxide layer 108.

Figure 1B:
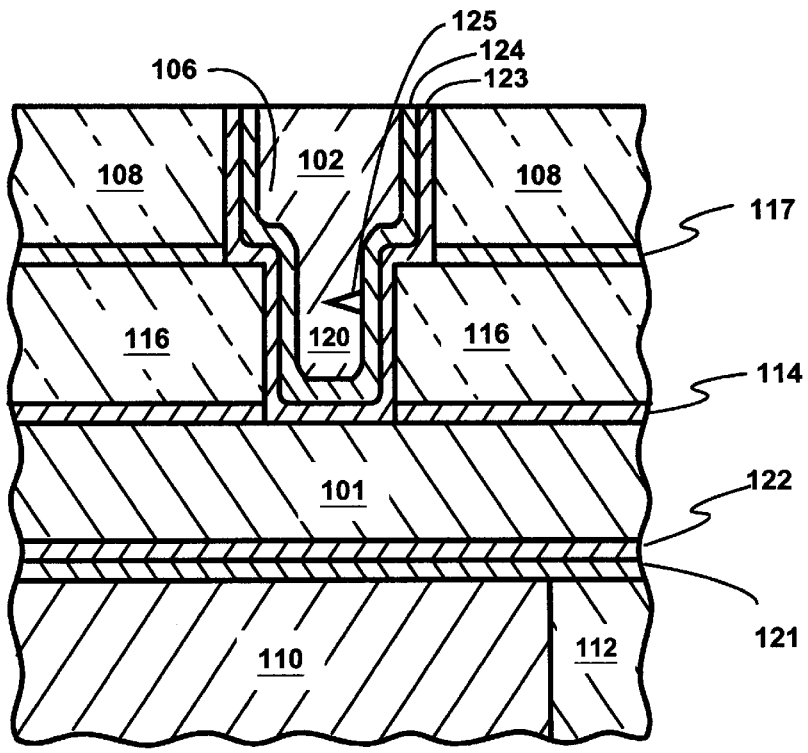
FIG. 1B (PRIOR ART) is a cross section of FIG. IA (PRIOR ART) along line 1B—1B.

Referring now to FIG. 1B (PRIOR ART), therein is shown a cross section of FIG. 1A (PRIOR ART) along 1B—1B. The first channel 101 is disposed either over a polysilicon gate 110 and/or a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area 104 of FIG. 1A (PRIOR ART) defines a via 120 when it is filled with the second conductive material. It will be understood by those skilled in the art that the channels and vias are not to scale, and that the channels and vias have high aspect ratios; i.e. they are much deeper than they are wide.

Also shown disposed around the first channel 101 are a barrier layer 121 and seed layer 122, and around the second channel 102 and the via 120 is a barrier layer 123 and seed layer 124. The barrier layers include barrier material combinations such as tantalum/tantalum nitride for copper seed layers and copper or copper alloy conductive materials.

In electroplating semiconductors, the semiconductor wafer 100 is placed in an electroplating bath having a solution of the conductive material ions, and the seed layer 124 is used as an electrode for the conductive material to be deposited upon. In the past, a number of different techniques of applying the plating current were used. Two approaches were forward and reverse pulse current and forward pulse current. The current densities of these approaches were constant with the compromise being made between trying to obtain a fine grain size of the deposited conductive material while avoiding void formation, such as a void 125, verses the time the process took.

Figure 2:
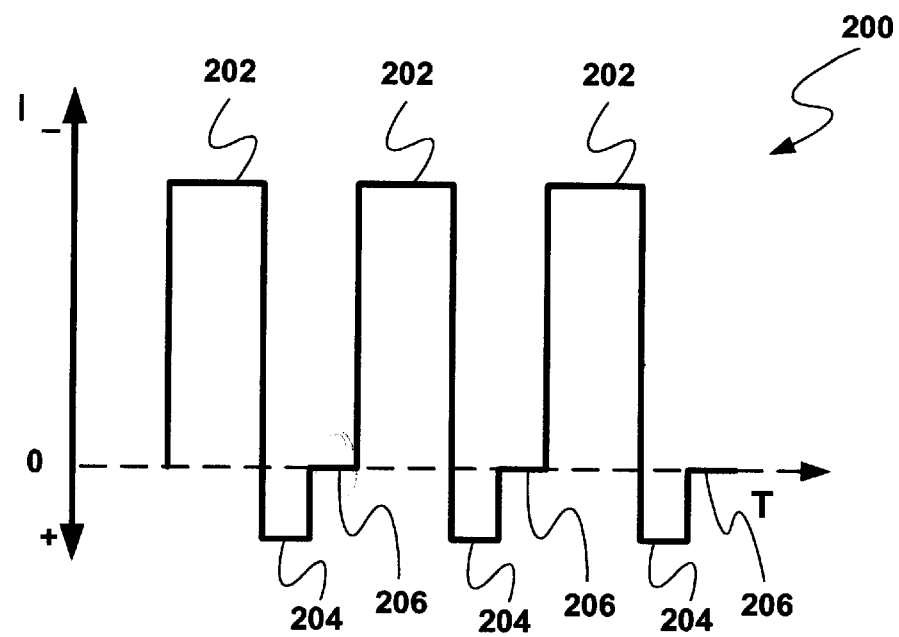
FIG. 2 (PRIOR ART) is a chart of a forward and reverse pulse current used for initial electroplating.

Referring now to FIG. 2 (PRIOR ART), therein is shown a chart of a forward and reverse pulse current 200. As would be understood in the process, there are many forward and reverse pulses, but three are shown for convenience. Forward pulses 202 are shown with reverse pulses 204 and zero intervals 206 in-between. The reverse pulses 204 immediately follow the forward pulses 202. This process causes lower stress deposition of the conductive material ions than just a strict forward pulse or direct current process, and lower roughness plating.

The deposition sequence includes the forward and reverse pulse current 200, nucleation, and deposition of a thin copper layer on the seed layer 124 followed by forward pulses only and/or direct current plating to quickly fill the large channels.

Figure 3:
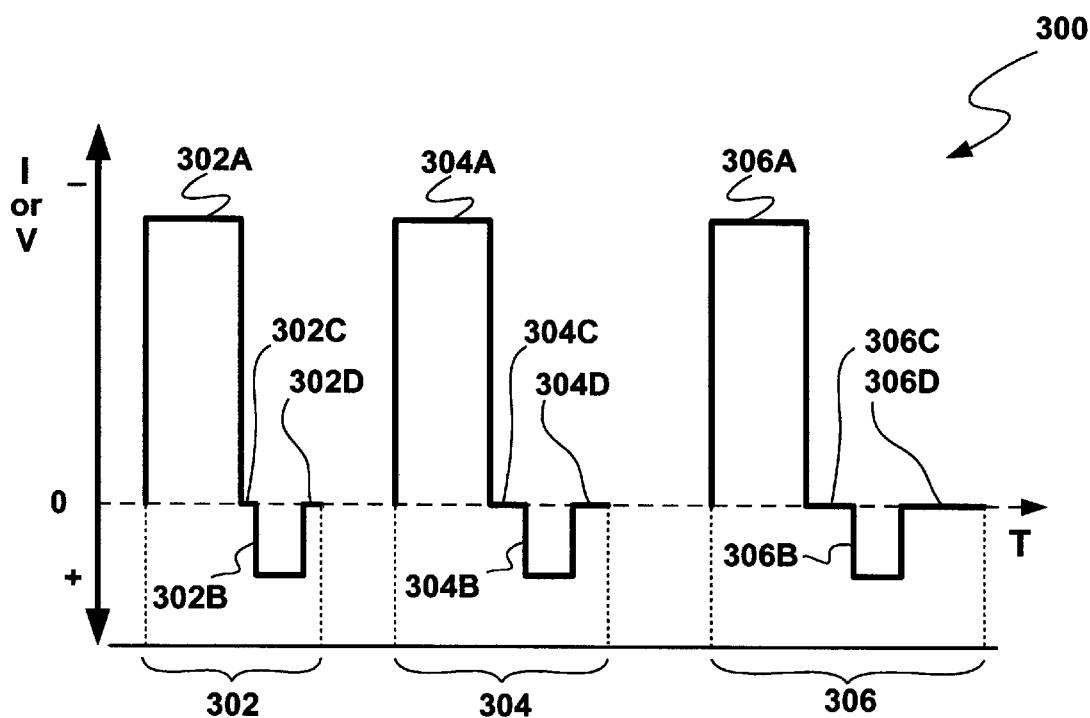
FIG. 3 is a chart of a time ramped forward and reverse pulse deposition process used for initial electroplating in the present invention.

Referring now to FIG. 3, therein is shown a chart of a time ramped forward and reverse pulse series 300, which could be current or voltage changes, used in the electroplating of very narrow channels and vias in practice of the present invention. The current ranges from 0.5 to 7 amps and from 0 to =5 volts. In the process of the present invention, there are many forward and reverse pulses, but there are also three different types of electrical cycles being utilized. A first, short electrical cycle 302 includes of a forward pulse 302A followed by a first, short zero interval 302B, then a reverse pulse 302C followed by a second, short zero interval 302D. The zero-interval is a period of zero current or voltage. A second, intermediate electrical cycle 304 consists of a forward pulse 304A followed by a first, intermediate zero interval 304B, and then a reverse pulse 304C followed by a second, intermediate zero interval 304D. A third, long electrical cycle 306 consists of a forward pulse 306A followed by a first, long zero interval 306B, then a reverse pulse 306C followed by a second, long zero interval 306D.

While three sets of electrical cycles 302, 304, and 306 are described, they are also examples of an alternate mode in which a continuous change is used in the zero interval durations from electrical cycle 302 to electrical cycle 304 to electrical cycle 306. The total duration of the electrical cycles ranges from 0.5 to 15.0 milliseconds for the current level of technology but will decrease with reduction of channel and via dimensions. It should be understood in each case, the first and second zero intervals are not necessarily of same duration. Further, the width of the forward and reverse pulses are also subject to variation.

The present invention provides low stress, void-free deposition of conductive material ions to the seed layer during electro-deposition by increasing the surface mobility of the plated ions.

Figure 4:
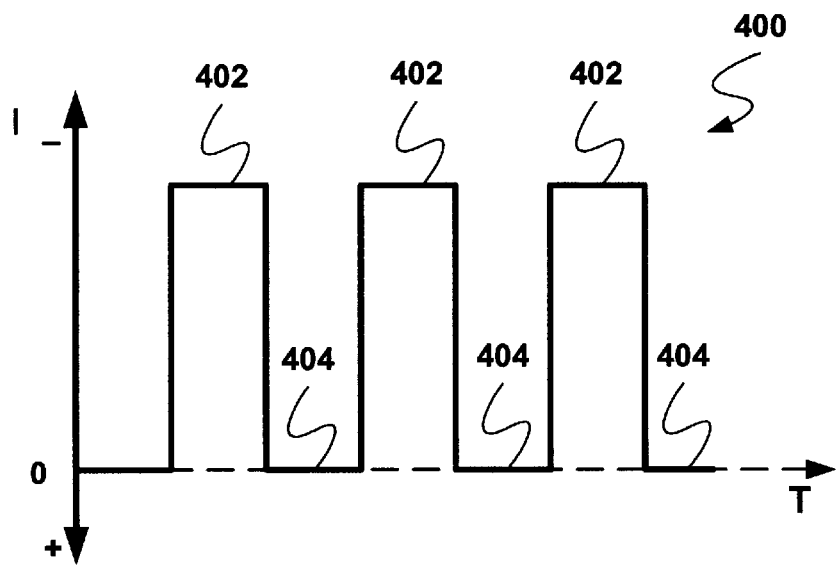
FIG. 4 (PRIOR ART) is a chart of a forward pulse current used for secondary electroplating.

Referring now to FIG. 4 (PRIOR ART), therein is shown a chart of forward pulse current 400 which was used in the past for electroplating the larger portions of the channels and vias. Again, there are many forward pulses, but three are shown for convenience. The forward pulse current 400 has forward pulses 402 followed by zero intervals 404. This provides for relatively fast electroplating.

Figure 5:
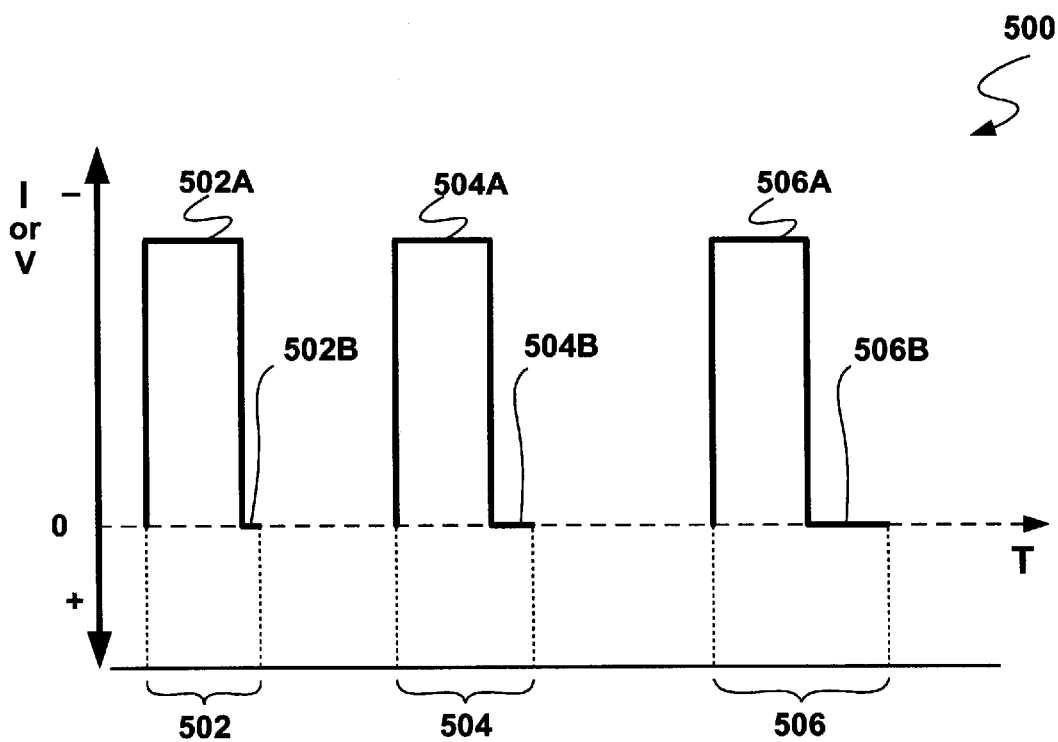
FIG. 5 is a chart of a time ramped forward pulse deposition process used for secondary electroplating in the present invention.

Referring now to FIG. 5, therein is shown a chart of a time ramped forward pulse series 500, which could be current or voltage changes, used in the electroplating of the large channels and vias in the practice of the present invention. The current ranges from 0.5 to 7 amps and from 0 to ±5 volts. Again, in the process of the present invention, there are many forward pulses, but there are also three different types of electrical cycles being utilized. A first, short electrical cycle 502 includes of a forward pulse 502A followed by a short zero interval 502B. A second, intermediate electrical cycle 504 consists of a forward pulse 504A followed by an intermediate zero interval 504B. A third, long electrical cycle 506 consists of a forward pulse 506A followed by a long zero interval 506B.

While three sets of electrical cycles 502, 504, and 506 are described, they are also be examples of a continuous change in the zero interval durations from electrical cycle 502 to electrical cycle 504 to electrical cycle 506. The total duration of the electrical cycles ranges from 0.5 to 15.0 milliseconds. for the current level of technology but will decrease with reduction of channel and via dimensions.

Operation

In production, a conventional first damascene process was used to dispose a first channel 101 shown in FIG. 1A (PRIOR ART) and FIG. 1B (PRIOR ART) in a first channel oxide layer (not shown) above portions of a semiconductor device (not shown) on a production semiconductor wafer 100. The damascene process starts with a photolithographic process which uses a mask to define a first channel opening (not shown) in the first channel oxide layer. The first channel opening is etched and then filled with a barrier layer and a seed layer. Examples of suitable seed materials include copper and copper alloys. The seed layer 124 is deposited using a conventional metal deposition technique such as ionized metal plasma (IMP). In these processes, the metal ions are charged and directed toward the semiconductor wafer 100 to be deposited.

For filling the large volumes of the channel 101, the time ramped forward pulse electroplating technique of the present invention is used to deposit the remainder of the first conductive material in the first channel 101. The short electrical cycle 502 of FIG. 5 is used initially because it allows the electroplating solution, which is rich in conductive material, to plate quickly on the forward pulses. As the conductive material is reduced in ion concentration in the channels, the zero intervals are increased or the intermediate electrical cycle 304 is used. This allows more time for the ion concentration of conductive material to increase in the electroplating solution near the channel surfaces before the forward plating pulses. As the ion concentration of conductive material is minimized because of the filling of the channels, the zero intervals are increased to a maximum or the long electrical cycle 306 is used.

A chemical-mechanical polishing process would then be used to remove the conductive material except where it is in the first channel oxide.

The stop nitride layer 114, the via oxide layer 116, and the via nitride layer 117 are successively deposited on top of the first channel 101 and the first channel oxide layer (not shown) using conventional deposition techniques.

By using the via photoresist and the via photolithographic process followed by nitride etching of the cross-sectional area 104 in the via nitride layer 117, the basis for the via 120 was formed. The subsequent deposition of the second channel oxide layer 108 prepares the way for the second channel 102 to be perpendicular to the first channel 101.

The second damascene process uses a further mask to define the second channel opening 106 in the second channel oxide layer 108. Since the second damascene process uses an anisotropic oxide etch, the etch also forms the via 120 down to the stop nitride layer 114. The anisotropic oxide etch etches faster in the vertical direction of FIG. 5 than in the horizontal direction. A nitride etch of the stop nitride layer 114 exposes a portion of the first channel 101 and completes the etching steps.

Next, a thin barrier layer (not shown) is deposited in the second channel opening 106 and the via 120 including along the walls of the second channel opening 106 and the via 120. The thickness of the barrier material is insufficient to fill the second channel opening 106 and the via 120. Thereafter, the thin seed layer 124 is deposited on the barrier layer in the second channel opening 106 and the via 120. Again, the thickness of the seed layer 124 is insufficient to fill the second channel opening 106 and the via 120.

The second conductive material, such as copper, is then deposited to form the via 120 and the second channel 102 using the time ramped forward and reverse pulse electroplating technique of the present invention. The short electrical cycle 302 of FIG. 3 is used initially because it allows the electroplating solution which is rich in conductive material ions to plate quickly on the forward pulses and be mixed on the reverse pulses. As the ion concentration of the conductive material is reduced in the via 120, the zero intervals are increased or the intermediate electrical cycle 304 is used. This allows more time for the ion concentration of conductive material to increase in the electroplating solution in the via 120 before the forward plating pulses. As the ion concentration of conductive material is minimized because of the filling of the via 120, the zero intervals are increased to a maximum or the long electrical cycle 306 is used. The time durations of the zero intervals are determined heuristically to prevent void formation while maximizing conductive material deposition speed.

For filling the large volumes of the second channel 102, the time ramped forward pulse electroplating technique of the present invention is used to deposit the remainder of the second conductive material in the second channel 102 as previously explained for filling the first channel 101.

Thereafter, a chemical-mechanical polishing process is used to complete the process to arrive at the structure shown and described in FIGS. 1A (PRIOR ART) and 1B (PRIOR ART).

While the best mode utilizes copper as the conductive material, it should be understood that the present invention is applicable to other conductive and electroplating materials in addition to copper, such as gold, silver, alloys thereof, and a combination thereof.

Further, although the embodiments of the present invention are directed to using the dual damascene technique, it also will be recognized by those skilled in the art that other techniques of forming interconnects or other traditional techniques of forming low resistance contacts or plugs which involve filling an opening with conductive materials such as tungsten or aluminum may be used to practice the present invention. In addition, while the embodiments of the present inventions form a seed layer in a channel opening and a via atop another conductive channel, it should be understood that the present invention is applicable to forming a seed layer in a channel opening and/or a via atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:
   providing a semiconductor with a dielectric layer formed thereon, wherein the dielectric layer overlays a region on the semiconductor;
   forming an opening in the dielectric layer, the opening defined by walls of the dielectric layer and exposing a portion of the region on the semiconductor;
   forming a seed layer over the dielectric layer and in the opening, including along the walls, the seed layer formed to a thickness insufficient to fill the opening; and
   depositing a layer of conductive material in contact with the seed layer by electroplating using electrical cycles with pulses for deposition having time intervals between pulses, said time intervals increases with increasing time, and the conductive material deposited to a thickness sufficient to fill the opening.

2. The method as claimed in claim 1 wherein the step of:
   depositing the layer of conductive material uses an electrical cycle with a forward pulse and a time interval before a subsequent forward pulse, the electrical cycle changing the time interval with increasing time.

3. The method as claimed in claim 1 wherein the step of:
   depositing the layer of conductive material is performed using an electrical cycle with a forward pulse and a time interval before a reverse pulse, the electrical cycle changing the time interval with increasing time.

4. The method as claimed in claim 1 wherein the step of:
   depositing the layer of conductive material uses an electrical cycle with a forward pulse and a reverse pulse and an changing time interval before a subsequent forward pulse and subsequent reverse pulse.

5. The method as claimed in claim 1 wherein the step of:
   forming the opening in the dielectric layer forms a channel and a via; and
   depositing the layer of conductive material in the via uses electrical cycles with a forward pulse and a first time interval before a reverse pulse and the reverse pulse with a second time interval different from the first time interval before a subsequent forward pulse.

6. The method as claimed in claim 1 wherein the step of:
   forming the opening in the dielectric layer forms a channel and a via;
   depositing the layer of conductive material in the via uses electrical cycles with a forward pulse and an changing time interval before a reverse pulse; and
   depositing the layer of conductive material in the channel uses electrical cycles with only a forward pulse and a time interval before a subsequent forward pulse, the electrical cycles having changing time intervals with increasing time.

7. The method as claimed in claim 1 wherein the step of:
   depositing the layer of conductive material uses a current from 0.5 to 7 amps.

8. The method as claimed in claim 1 wherein the step of:
   depositing the layer of conductive material uses a voltage from 0 to ±5 volts.

9. The method as claimed in claim 1 wherein the step of:
   depositing the layer of conductive material uses an electrical cycle duration of 0.5 to 15 milliseconds.

10. The method as claimed in claim 1 wherein the step of:
    depositing the layer of conductive material uses a conductive material selected from a group consisting of copper, gold, silver, an alloy thereof, and a combination thereof.

11. A method of manufacturing a semiconductor device, comprising the steps of:
    providing a semiconductor with a dielectric layer formed thereon, wherein the dielectric layer overlays a region on the semiconductor;
    forming an opening in the dielectric layer, the opening defined by walls of the dielectric layer and exposing a portion of the region on the semiconductor;
    forming a copper seed layer over the dielectric layer and in the opening, including along the walls, the seed layer formed to a thickness insufficient to fill the opening; and
    depositing a layer of copper in contact with the seed layer by electroplating using electrical cycles with pulses for deposition having time intervals between pulses, said time intervals increasing with increasing time, and the copper deposited to a thickness sufficient to fill the opening.

12. The method as claimed in claim 11 wherein the step of:
    depositing the layer of copper uses an electrical cycle with a forward pulse and a time interval before a subsequent forward pulse, the electrical cycle increasing the time interval with increasing time.

13. The method as claimed in claim 11 wherein the step of:
    depositing the copper is performed using uses an electrical cycle with a forward pulse and a time interval before a reverse pulse, the electrical cycle increasing the time interval with increasing time.

14. The method as claimed in claim 11 wherein the step of:
    depositing the layer of copper is performed using an electrical cycle with a forward pulse and a reverse pulse and an increasing time interval before a subsequent forward pulse and subsequent reverse pulse.

15. The method as claimed in claim 11 wherein the step of:
   forming the opening in the dielectric layer forms a channel and a via; and
   depositing the copper in the via is performed using an electrical cycle with a forward pulse and a first time interval before a reverse pulse and the reverse pulse with a second time interval before a subsequent forward pulse, the electrical cycle having increasing time intervals with increasing time.

16. The method as claimed in claim 11 wherein the step of:
   forming the opening in the dielectric layer forms a channel and a via;
   depositing the layer of copper in the via is performed using electrical cycles with a forward pulse and an increasing time interval before a reverse pulse; and
   depositing the layer of copper in the channel is performed using electrical cycles with only a forward pulse and a time interval before a subsequent forward pulse, the electrical cycles having increasing time intervals with increasing time.

17. The method as claimed in claim 11 wherein the step of:
   depositing the copper is performed using a current from 0.5 to 7 amps, a voltage from 0 to ±5 volts, and the electrical cycles have durations between 0.5 and 15 milliseconds.

18. A method of manufacturing a semiconductor device, comprising the steps of:
   providing a semiconductor with a dielectric layer formed thereon, wherein the dielectric layer overlays a region on the semiconductor;
   forming an opening in the dielectric layer, the opening defined by walls of the dielectric layer and exposing a portion of the region on the semiconductor;
   forming a copper seed layer over the dielectric layer and in the opening, including along the walls, the copper seed layer formed to a thickness insufficient to fill the opening;
   depositing a first layer of copper in contact with the copper seed layer by electroplating using a first electrical cycle with a forward pulse and a first time interval before a reverse pulse and a second time interval before a subsequent forward pulse; and
   depositing a second layer of copper on the first layer of copper by electroplating using a second electrical cycle with a forward pulse and a third time interval before a subsequent forward pulse, the second layer of copper substantially filling the opening.

19. The method as claimed in claim 18 wherein the time intervals increase in steps.

20. The method as claimed in claim 19 wherein the time intervals increase continuously.

* * * * *